(12) United States Patent
Hashinaga et al.

(10) Patent No.: US 12,334,874 B2
(45) Date of Patent: Jun. 17, 2025

(54) HIGH FREQUENCY AMPLIFIER

(71) Applicant: SUMITOMO ELECTRIC INDUSTRIES, LTD., Osaka (JP)

(72) Inventors: Tatsuya Hashinaga, Osaka (JP); Yutaka Moriyama, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 559 days.

(21) Appl. No.: 17/757,310

(22) PCT Filed: Jan. 5, 2021

(86) PCT No.: PCT/JP2021/000127
§ 371 (c)(1),
(2) Date: Jun. 14, 2022

(87) PCT Pub. No.: WO2021/141030
PCT Pub. Date: Jul. 15, 2021

(65) Prior Publication Data
US 2022/0376658 A1  Nov. 24, 2022

(30) Foreign Application Priority Data

Jan. 10, 2020 (JP) ................................. 2020-002882

(51) Int. Cl.
*H03F 3/68* (2006.01)
*H03F 1/02* (2006.01)
(Continued)

(52) U.S. Cl.
CPC ........... *H03F 1/0288* (2013.01); *H03F 3/195* (2013.01); *H03F 3/211* (2013.01); *H03F 3/602* (2013.01); *H03F 2200/451* (2013.01)

(58) Field of Classification Search
CPC .. H03F 1/0288; H03F 3/195; H03F 2200/451; H03F 3/211; H03F 3/602;
(Continued)

(56) References Cited

U.S. PATENT DOCUMENTS 6,825,719 B1 * 11/2004 Barak ................... H03F 1/0294
330/129
2007/0164819 A1   7/2007 Urata et al.
(Continued)

FOREIGN PATENT DOCUMENTS

CN   101594117   12/2009
CN   109660212    4/2019
(Continued)

*Primary Examiner* — Khanh V Nguyen
(74) *Attorney, Agent, or Firm* — IPUSA, PLLC (57) ABSTRACT

A high frequency amplifier includes an asymmetric Doherty amplifier configured to amplify a high frequency signal having a wavelength $\lambda$, the high frequency signal being input, and the asymmetric Doherty amplifier including a carrier amplifier and a peak amplifier, the peak amplifier being configured to start an amplifying operation when an output of the carrier amplifier reaches a saturation region and having a saturation output different from a saturation output of the carrier amplifier, a driver amplifier configured to drive the asymmetric Doherty amplifier, a branch circuit configured to branch the high frequency signal amplified by the driver amplifier into an input path on a peak amplifier side and an input path on a carrier amplifier side, a phase adjustment circuit configured to delay either a phase of a signal input to the peak amplifier or a phase of a signal input to the carrier amplifier, the phase adjustment circuit being provided on either the input path on the peak amplifier side or the input path on the carrier amplifier, a first substrate on which the carrier amplifier and the peak amplifier are mounted, and a second substrate on which the driver amplifier, the branch circuit, and the phase adjustment circuit are (Continued)

mounted. An input terminal of the driver amplifier and an input terminal of the carrier amplifier are disposed at positions where the input terminal of the driver amplifier and the input terminal of the carrier amplifier project to each other when the second substrate is stacked on the first substrate. An electrical length from the input terminal of the driver amplifier to an output terminal of the carrier amplifier is set to a phase of $(2n+1) \times \pi$, where n is an integer greater than or equal to 0.

5 Claims, 8 Drawing Sheets

(51) Int. Cl.
*H03F 3/195* (2006.01)
*H03F 3/21* (2006.01)
*H03F 3/60* (2006.01)

(58) Field of Classification Search
CPC ........ H03F 3/68; H05K 1/0243; H05K 1/185; H05K 2201/10015; H05K 2201/1003
USPC .............................................. 330/124 R, 295
See application file for complete search history.

(56) References Cited

U.S. PATENT DOCUMENTS

| | | |
|---|---|---|
| 2009/0045877 A1 | 2/2009 | Wang et al. |
| 2012/0286861 A1 | 11/2012 | Bowles et al. |
| 2015/0349731 A1 | 12/2015 | Kwon et al. |
| 2016/0049910 A1* | 2/2016 | Datta .................... H03F 1/0288 |
| | | 333/124 |
| 2018/0159479 A1 | 6/2018 | Wu et al. |
| 2019/0173430 A1 | 6/2019 | Krehbiel et al. |
| 2019/0173431 A1 | 6/2019 | Srinidhi Embar et al. |

FOREIGN PATENT DOCUMENTS

| | | |
|---|---|---|
| JP | 2010-273117 | 12/2010 |
| JP | 2016-528782 | 9/2016 |
| TW | 200910757 | 3/2009 |
| WO | 2005/093948 | 10/2005 |
| WO | 2014/210269 | 12/2014 |

* cited by examiner

HIGH FREQUENCY AMPLIFIER

TECHNICAL FIELD

The present disclosure relates to a high frequency amplifier.

This application is based upon and claims priority to Japanese Patent Application No. 2020-002882, filed Jan. 10, 2020, the entire contents of which are incorporated herein by reference.

BACKGROUND ART

In recent years, broader bandwidths of mobile communication systems such as mobile phones are developed. Therefore, for a power amplifier used in base station equipment of the system and the like, it is desirable to improve the power efficiency in a high frequency band and the like. As power amplifiers for achieving the improvement of the power efficiency, the Doherty amplifier including a carrier amplifier (also referred to as a main amplifier) and a peak amplifier is known. For example, Patent Document 1 discloses the structure of a Doherty amplifier. Here, the Doherty amplifier is normally used by being connected at a stage subsequent to a driver amplifier.

RELATED ART DOCUMENTS

Patent Documents

[Patent Document 1] WO 2005/093948

SUMMARY OF THE INVENTION

A radio frequency amplifier according to one aspect of the present disclosure includes an asymmetric Doherty amplifier configured to amplify a high frequency signal having a wavelength λ, the high frequency signal being input, and the asymmetric Doherty amplifier including a carrier amplifier and a peak amplifier, the peak amplifier being configured to start an amplifying operation when an output of the carrier amplifier reaches a saturation region and having a saturation output different from a saturation output of the carrier amplifier, a driver amplifier configured to drive the asymmetric Doherty amplifier, a branch circuit configured to branch the high frequency signal amplified by the driver amplifier into an input path on a peak amplifier side and an input path on a carrier amplifier side, a phase adjustment circuit configured to delay either a phase of a signal input to the peak amplifier or a phase of a signal input to the carrier amplifier, the phase adjustment circuit being provided on either the input path on the peak amplifier side or the input path on the carrier amplifier, a first substrate on which the carrier amplifier and the peak amplifier are mounted, and a second substrate on which the driver amplifier, the branch circuit, and the phase adjustment circuit are mounted. An input terminal of the driver amplifier and an input terminal of the carrier amplifier are disposed at positions where the input terminal of the driver amplifier and the input terminal of the carrier amplifier project to each other when the second substrate is stacked on the first substrate. An electrical length from the input terminal of the driver amplifier to an output terminal of the carrier amplifier is set to a phase of $(2n+1) \times \pi$, where n is an integer greater than or equal to 0.

EMBODIMENT FOR CARRYING OUT THE INVENTION

Problems to be Solved by the Present Disclosure

When a driver amplifier and a Doherty amplifier are mounted on a printed circuit board, if a driver amplifier, a carrier amplifier, and a peak amplifier are mounted on the same plane, a large size printed circuit board is required, and consequently it is difficult to reduce the size of the amplifier. In this case, it is conceivable that the driver amplifier and the Doherty amplifier are implemented in three dimensions. However, if an amplifier is famed to have a two-stage structure, for example, and a driver amplifier is disposed at an upper stage and a carrier amplifier and a peak amplifier are disposed at a lower stage, the driver amplifier and the carrier amplifier may be positioned close to each other in the up and down direction. This causes a problem that the driver amplifier may become unstable.

The present disclosure is provided in view of the above-described conditions, and has an object to provide a stable high frequency amplifier.

Effect of the Present Disclosure

According to the present disclosure, a stable high frequency amplifier can be provided.

DESCRIPTION OF EMBODIMENTS OF THE PRESENT DISCLOSURE

First, the contents of the embodiment of the present disclosure will be listed and described.

(1) A radio frequency amplifier according to the present disclosure includes an asymmetric Doherty amplifier configured to amplify a high frequency signal having a wavelength λ, the high frequency signal being input, and the asymmetric Doherty amplifier including a carrier amplifier and a peak amplifier, the peak amplifier being configured to start an amplifying operation when an output of the carrier amplifier reaches a saturation region and having a saturation output different from a saturation output of the carrier amplifier, a driver amplifier configured to drive the asymmetric Doherty amplifier, a branch circuit configured to branch the high frequency signal amplified by the driver amplifier into an input path on a peak amplifier side and an input path on a carrier amplifier side, a phase adjustment circuit configured to delay either a phase of a signal input to the peak amplifier or a phase of a signal input to the carrier amplifier, the phase adjustment circuit being provided on either the input path on the peak amplifier side or the input path on the carrier amplifier, a first substrate on which the carrier amplifier and the peak amplifier are mounted, and a second substrate on which the driver amplifier, the branch circuit, and the phase adjustment circuit are mounted. An input terminal of the driver amplifier and an input terminal of the carrier amplifier are disposed at positions where the input terminal of the driver amplifier and the input terminal of the carrier amplifier project to each other when the second substrate is stacked on the first substrate. An electrical length from the input terminal of the driver amplifier to an output terminal of the carrier amplifier is set to a phase of $(2n+1)\times\pi$, where n is an integer greater than or equal to 0.

Thus, even when signal feedback occurs (a portion of the output signal is fed back from the output of the carrier amplifier to the input of the driver amplifier), the electrical length is in a range in which the driver amplifier does not cause instability (a negative feedback region), and is not in a positive feedback region. Therefore, the amplifier can be stabilized even when a two-stage structure is employed.

(2) In one aspect of the high frequency amplifier of the present disclosure, a phase difference between a high frequency signal at an output terminal of the carrier amplifier and a high frequency signal at an output terminal of the peak amplifier is in the range of $\pi/2$ to $3\pi/2$.

The phase difference between the output signals of the carrier amplifier and the peak amplifier is in the range of $\pi/2$ to $3\pi/2$, so that electromagnetic waves emitted from the carrier amplifier and the peak amplifier can be minimized.

(3) In one aspect of the radio frequency amplifier of the present disclosure, a grounded metal layer is disposed between the first substrate and the second substrate.

The grounded metal layer can block the electromagnetic waves. Therefore, the first substrate is not easily influenced by the electromagnetic waves generated on the second substrate side, and the second substrate is not easily influenced by the electromagnetic waves generated on the first substrate side.

(4) In one aspect of the radio frequency amplifier of the present disclosure, the first substrate has a planar shape projected by the second substrate.

Reduction of the size of the high frequency amplifier can be achieved.

(5) In one aspect of the radio frequency amplifier of the present disclosure, the peak amplifier is configured to have a saturation output greater than a saturation output of the carrier amplifier.

In the peak amplifier, the amount of a phase shift to achieve optimal matching is greater than that of the carrier amplifier.

DETAILS OF EMBODIMENTS OF THE PRESENT DISCLOSURE

Figure 1:
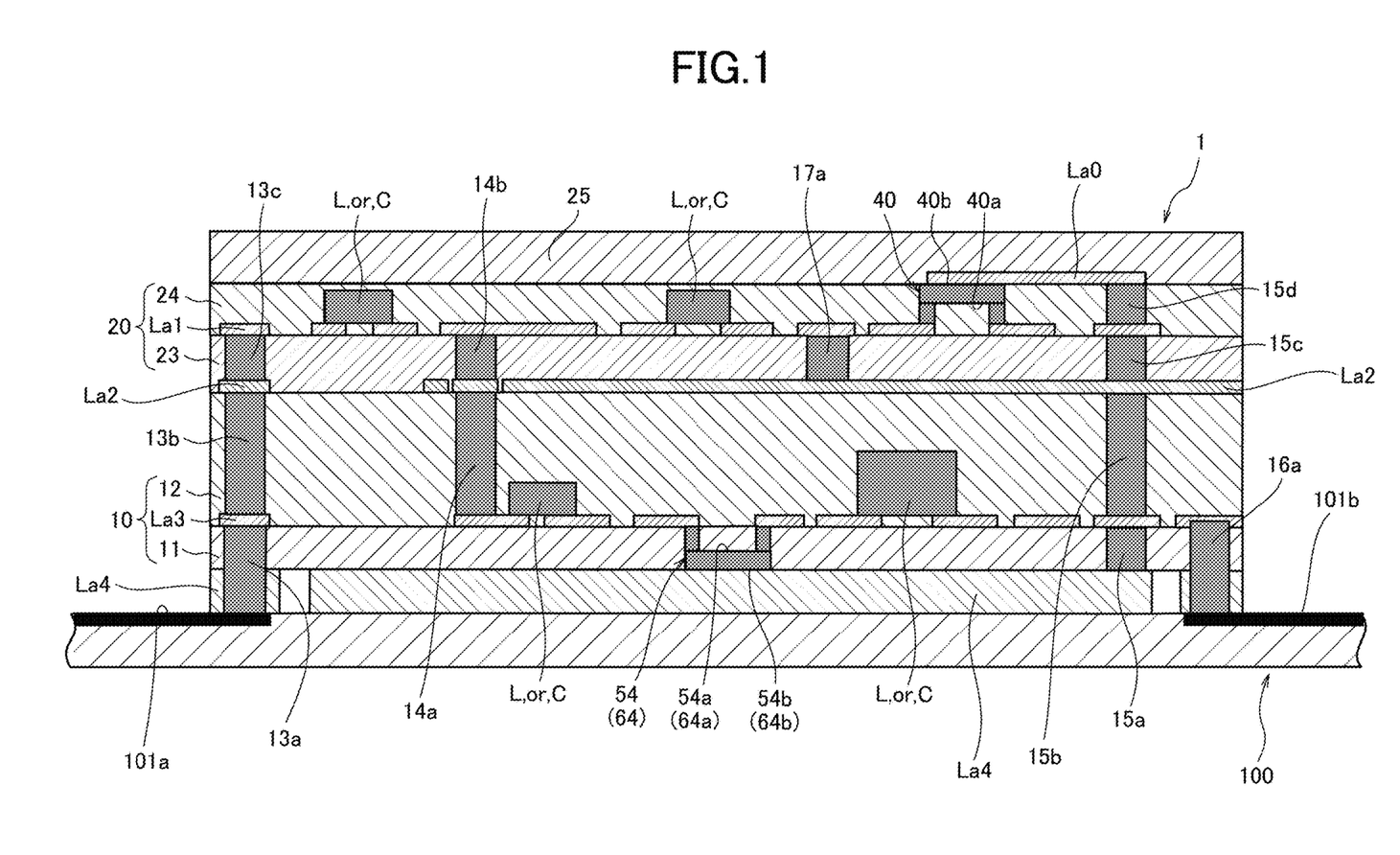
FIG. 1 is a cross-sectional view schematically illustrating a high frequency amplifier according to one aspect of the present disclosure.

In the following, a specific example of a high frequency amplifier according to the present disclosure will be described with reference to the accompanying drawings. FIG. 1 is a cross-sectional view schematically illustrating a high frequency amplifier according to one aspect of the present disclosure.

A high frequency amplifier 1 is mounted in a communication device, such as base station equipment of a mobile communication system, and is used to amplify transmission signals, for example. The high frequency amplifier 1 includes a base member La4. The base member La4 is a plate made of metal (e.g., copper) that functions as both heat dissipation and an external terminal, and is disposed on a printed circuit board 100 of a communication device.

A lower stage 10, an upper stage 20, and a lid member 25 are mounted on the base member La4. The lower stage 10 corresponds to a first substrate of the present disclosure, and the upper stage 20 corresponds to a second substrate of the present disclosure.

The lower stage 10 is disposed and sandwiched between the base member La4 and the upper stage 20. The lower stage 10 includes a first dielectric layer 11 (e.g., 0.25 to 0.35 mm thick), a third wiring layer La3 (e.g., 18 to 35 μm thick), and a second dielectric layer 12 (e.g., 0.8 to 1.0 mm thick). The first dielectric layer 11 is provided on the base member La4 (e.g., 0.25 mm thick) and in the third wiring layer La3, a high frequency line pattern using, as a reference voltage, the base member La4 forming a GND surface is formed, and active components such as a carrier amplifier 54 and a peak amplifier 64, as well as an inductor L or a capacitor C are implemented.

The carrier amplifier 54 and the peak amplifier 64 have front surfaces 54a and 64a on which predetermined circuits are formed and back surfaces 54b and 64b on which no circuit is formed, for example. The back surfaces 54b and 64b are located opposite to the front surfaces 54a and 64a. The carrier amplifier 54 and the peak amplifier 64 are embedded in the first dielectric layer 11, and both the front surfaces 54a and 64a face upward and are implemented to the third wiring layer La3. Both the back surfaces 54b and 64b are disposed to face downward to be in contact with the base member La4 and are bonded to the base member La4 on which a sintered silver paste or a sintered copper paste is coated.

The upper stage 20 is stacked on the lower stage 10. The upper stage 20 includes a third dielectric layer 23 (e.g., 0.25 to 0.35 mm thick), a first wiring layer La1 (e.g., 18 to 35 μm thick), and a fourth dielectric layer 24 (e.g., 0.25 to 0.35 mm thick). A second wiring layer La2 is disposed between the third dielectric layer 23 and the lower stage 10 (the second dielectric layer 12). The second wiring layer La2 (e.g., 35 μm thick) is a solid pattern made of, for example, copper, and serves as a GND surface for the first wiring layer La1 and serves to block electromagnetic waves generated between the upper stage 20 and the lower stage 10. The second wiring layer La2 corresponds to a grounded metal layer of the present disclosure.

A high frequency line pattern is formed in the first wiring layer La1, and active components such as the driver amplifier 40, as well as the inductors L or the capacitors C are implemented.

The driver amplifier 40 has a front surface 40a on which a predetermined circuit is formed and a back surface 40b on which no circuit is formed, for example. The back surface 40b is positioned opposite to the front surface 40a. The driver amplifier 40 is embedded in the fourth dielectric layer 24 and is implemented to the first wiring layer La1 with the front surface 40a facing the lower stage 10. The back surface 40b is disposed upward spaced from the lower stage 10.

The upper stage 20 is covered by the lid member 25 made of metal. The driver amplifier 40 is implemented in a flip chip (face down), and thus, from the viewpoint of thermal management, the back surface 40b of the driver amplifier 40 is positioned upward to contact a heat dissipation portion (a zeroth wiring layer La0) of the lid member 25. The heat dissipation portion (the zeroth wiring layer La0) is formed of a thin metal layer for signal wiring, as with other wiring layers. Then, the heat dissipation portion (the zeroth wiring layer La0) is in contact with a GND via (e.g., φ300 μm) (heat dissipation vias 15d, 15c, 15b, and 15a) that is close. Therefore, a heat dissipation path from the driver amplifier 40 to the base member La4 (hereinafter, referred to as a first heat dissipation path) is formed.

Here, signal vias 14*b* and 14*a* are used to obtain an electrical path between the first wiring layer La1 of the upper stage 20 and the third wiring layer La3 of the lower stage 10. Additionally, the signal via 17*a* is used to obtain an electrical path between the first wiring layer La1 and the second wiring layer La2. Further, signal vias 13*c*, 13*b*, and 13*a* are used to obtain an electrical path between the first wiring layer La1 and the base member La4. A signal via 16*a* is used to obtain an electrical path between the third wiring layer La3 and the base member La4.

As described, the upper stage 20 is stacked on the lower stage 10, and the driver amplifier 40, the carrier amplifier 54, and the peak amplifier 64 are implemented in three dimensions, thereby achieving a reduction in the size of the high frequency amplifier 1, such as 6 square mm as the module size of the outermost shape and 2.2 mm thickness.

Additionally, the high frequency amplifier 1 does not require a wire bond connection. Thus, a large panel having a size of, for example, 500 square mm can be put through the manufacturing process, and panels having a size of 6 square mm, for example, 6,000 panels can be obtained from the panel. Thus, a significant reduction in the cost can be achieved by reducing the processing cost and the material cost.

Figure 3:
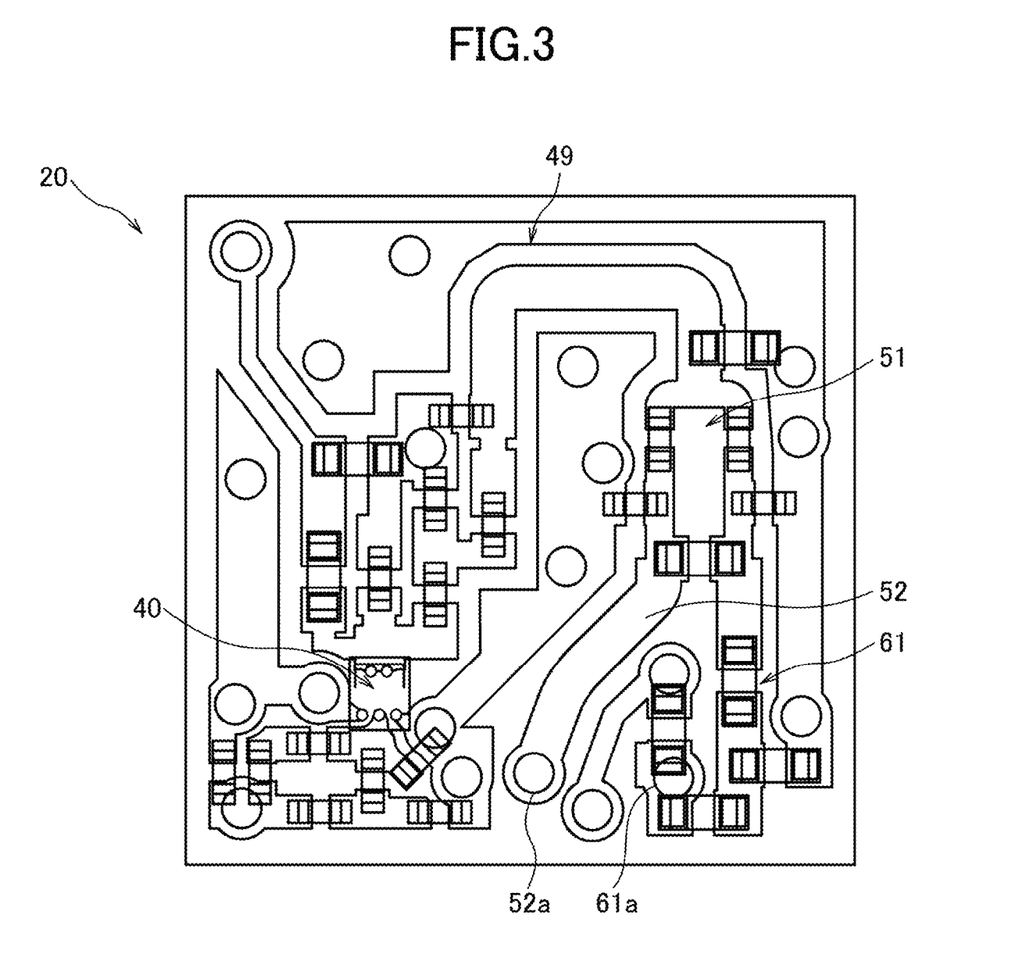
FIG. 3 is a plan view of an upper portion of FIG. 1.

Here, when the upper stage 20 described with reference to FIG. 3 is stacked on the lower stage 10 described with reference to FIG. 4, an input terminal of the driver amplifier 40 and an input terminal of the carrier amplifier 54 face each other in the up and down direction, the distance between the input terminal of the driver amplifier 40 and the input terminal of the carrier amplifier 54 is, for example, 1 mm or less in the up and down direction, and the distance between the driver amplifier 40 and the carrier amplifier 54 is significantly reduced, compared with the case where the driver amplifier 40 and the carrier amplifier 54 are disposed on the same plane. In such a physical arrangement, when a phase difference between two input signals is in the range of $\pm\pi/2$, interference between the two input signals occurs, and consequently, the operation of the driver amplifier 40 becomes unstable. Specifically, the output signal of the driver amplifier 40 may be fed back to the input and the driver amplifier 40 may oscillate.

Thus, in the high frequency amplifier 1, the electrical length between the input terminal of the driver amplifier 40 and the output terminal of the carrier amplifier 54, that is, the electrical length obtained by adding length of chip parts to the wiring length, or the delay time in which the input signal having a wavelength $\lambda$ is transmitted from the input terminal of the driver amplifier 40 to the output terminal of the carrier amplifier 54, including the chip parts between the terminals, is converted into a phase of the input signal having the wavelength $\lambda$ and the electrical length between the terminals is set so that the phase is $(2n+1)\times\pi$. Here, n is an integer greater than or equal to 0.

In order to achieve this, a path from a drain output of the driver amplifier 40 to a branch circuit 51 is largely bypassed from the center to the right half of the upper stage 20, for example, as indicated by a curve pattern 49 in FIG. 3, and a path from an output of the branch circuit 51 to a via 52*a* is formed in a curve rather than a line, as indicated by a curve pattern 52 in FIG. 3.

As described, the electrical length from the input terminal of the driver amplifier 40 to the output terminal of the carrier amplifier 54 is set to be a phase of $(2n+1)\times\pi$. Thus, even if signal feedback occurs, that is, a portion of the output signal is fed back from the output of the carrier amplifier 54 to the input of the driver amplifier 40, the electrical length is in the range in which the driver amplifier 40 does not cause instability, in short, in a negative feedback region, and is not $2n\pi$, i.e., in a positive feedback region in which instability occurs. Therefore, the amplifier 1 can be stabilized even when a two-stage structure is employed.

Furthermore, in a general Doherty amplifier, the phase difference between the carrier amplifier and the peak amplifier is set to $\pi/2$, but in the high frequency amplifier 1, the phase difference is instead set to n. That is, the phase difference between the RF signal at the output terminal of the carrier amplifier 54 and the RF signal at the output terminal of the peak amplifier 64 is in the range of $\pi/2$ to $3\pi/2$.

This causes the electromagnetic waves emitted from the carrier amplifier 54 and the electromagnetic waves emitted from the peak amplifier 64 to be canceled in a close area, thereby reducing the electromagnetic waves emitted to the outside of the high frequency amplifier 1.

Here, the phase of the carrier amplifier 54 and the phase of the peak amplifier 64 are synchronized at an output terminal RFout by a phase adjustment circuit 61, which will be described with reference to FIG. 3, input matching circuits 53 and 63, which will be described with reference to FIG. 7 and FIG. 8, output matching circuits 55 and 65, and a transmission line TRL1 (a 90° transmission line 56*a*, which will be described with reference to FIG. 4).

Figure 2:
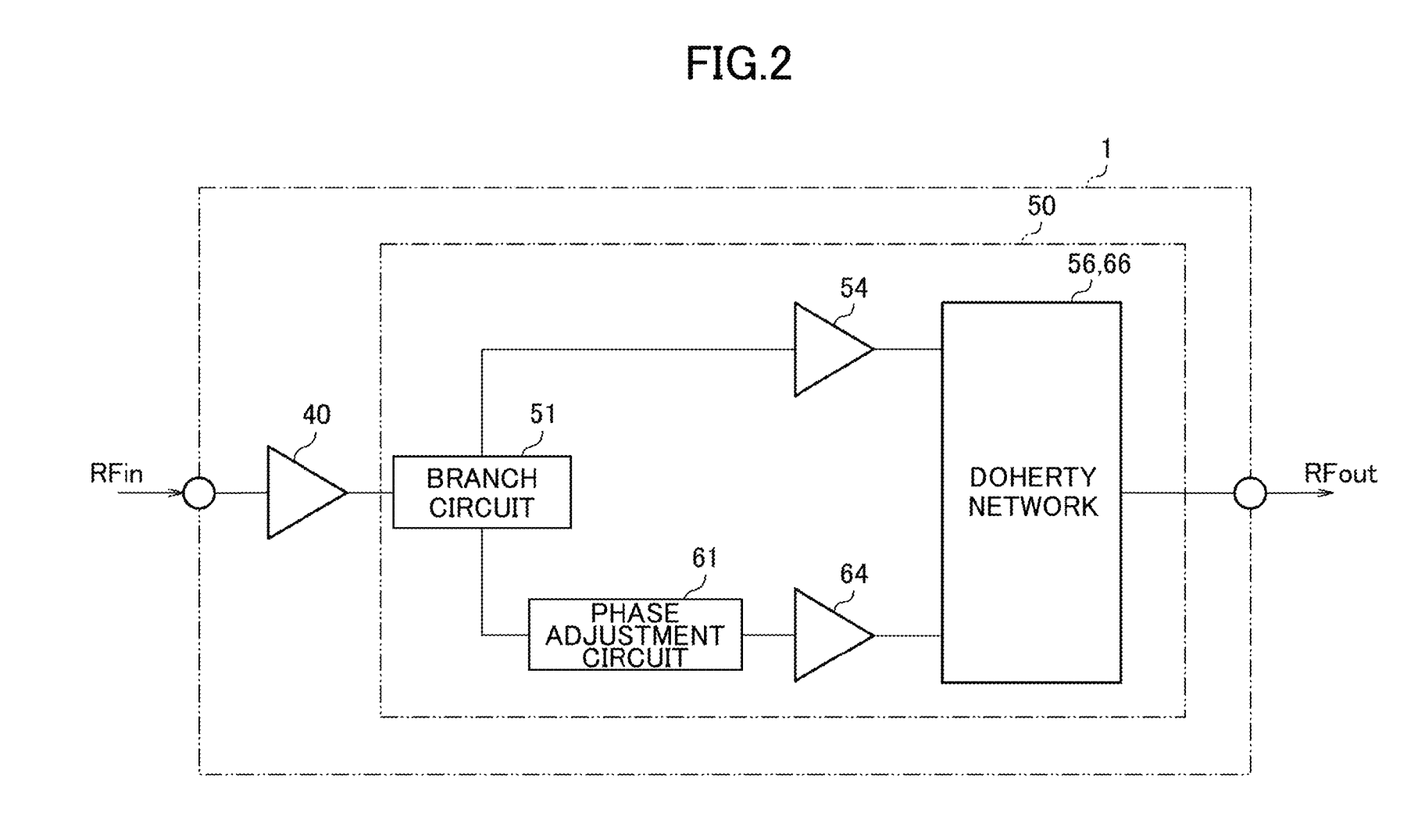
FIG. 2 is a block diagram depicting the high frequency amplifier of FIG. 1.

FIG. 2 is a block diagram depicting the high frequency amplifier of FIG. 1. FIG. 3 is a plan view of the upper stage in FIG. 1, and FIG. 4 is a plan view of the lower stage in FIG. 1.

The high frequency amplifier 1 includes the driver amplifier 40 and a Doherty amplifier 50 provided in a stage subsequent to the driver amplifier 40, and is configured to amplify a signal in the frequency band of, for example, 5 GHz to 6 GHz.

The driver amplifier 40 amplifies a radio frequency (RF) signal defined by the wavelength $\lambda$ that is input to an input terminal RFin such that the Doherty amplifier 50 can amplify the signal to a predetermined transmit power level.

The Doherty amplifier 50 includes a branch circuit 51, a phase adjustment circuit 61, a carrier amplifier 54, a peak amplifier 64, and Doherty networks 56 and 66 and further amplifies the RF signal amplified by the driver amplifier 40 and outputs the signal from the output terminal RFout.

The driver amplifier 40, the carrier amplifier 54, and the peak amplifier 64 are amplifiers using, for example, high electron mobility transistors (GaN-HEMTs) as amplifier elements. In the driver amplifier 40, the carrier amplifier 54, and the peak amplifier 64, each gate pad is provided on one side of a rectangular shape and each drain pad is provided on a side opposing a corresponding gate pad.

Here, in the driver amplifier 40, the carrier amplifier 54, and the peak amplifier 64, source pads are provided on both sides of the gate pad. However, in the driver amplifier 40, two source pads are connected to GND formed in the upper stage 20. With respect to this, in the carrier amplifier 54 and the peak amplifier 64, the source pads are connected to the base member La4 via the back surfaces 54*b* and 64*b* described with reference to FIG. 1. This can obtain GND and form a heat dissipation path (hereinafter, referred to as a second heat dissipation path) from the carrier amplifier 54 and the peak amplifier 64 to the base member La4.

The second heat dissipation path is thought to have a better heat dissipation property in comparison with the first heat dissipation path. In the second heat dissipation path, the source pads of the carrier amplifier 54 and the peak amplifier 64 are connected to the base member La4 via the back surfaces 54b and 64b, respectively. The base member La4 is a plate made of metal (e.g., copper) and has an excellent heat dissipation property. In the first heat dissipation path, the source pad of the driver amplifier 40 is connected to the heat dissipation portion (the zeroth wiring layer La0) through the back surface 40b, and is connected to the base member La4 through the close GND via. The zeroth wiring layer La0 is a thin metal film for the signal wiring, and thus, from the viewpoint of heat dissipation efficiency, the zeroth wiring layer La0 has less efficiency than the base member La4 that is a plate made of metal (e.g., copper). As a result, because this dissipation portion (the zeroth wiring layer La0) limits the rate of the heat conduction, the second dissipation path appears to have a better heat dissipation property than the first heat sink path.

With respect to the first heat dissipation path, it is conceivable that the efficiency of the heat dissipation of the first heat dissipation path can be improved by further expanding the diameters of the heat dissipation vias 15a, 15b, 15c, and 15d or further providing a dissipation via in parallel with the existing heat dissipation path (the first heat dissipation path) for the heat dissipation path connecting the heat dissipation portion (the zeroth wiring layer La0) and the base member La4.

Figure 4:
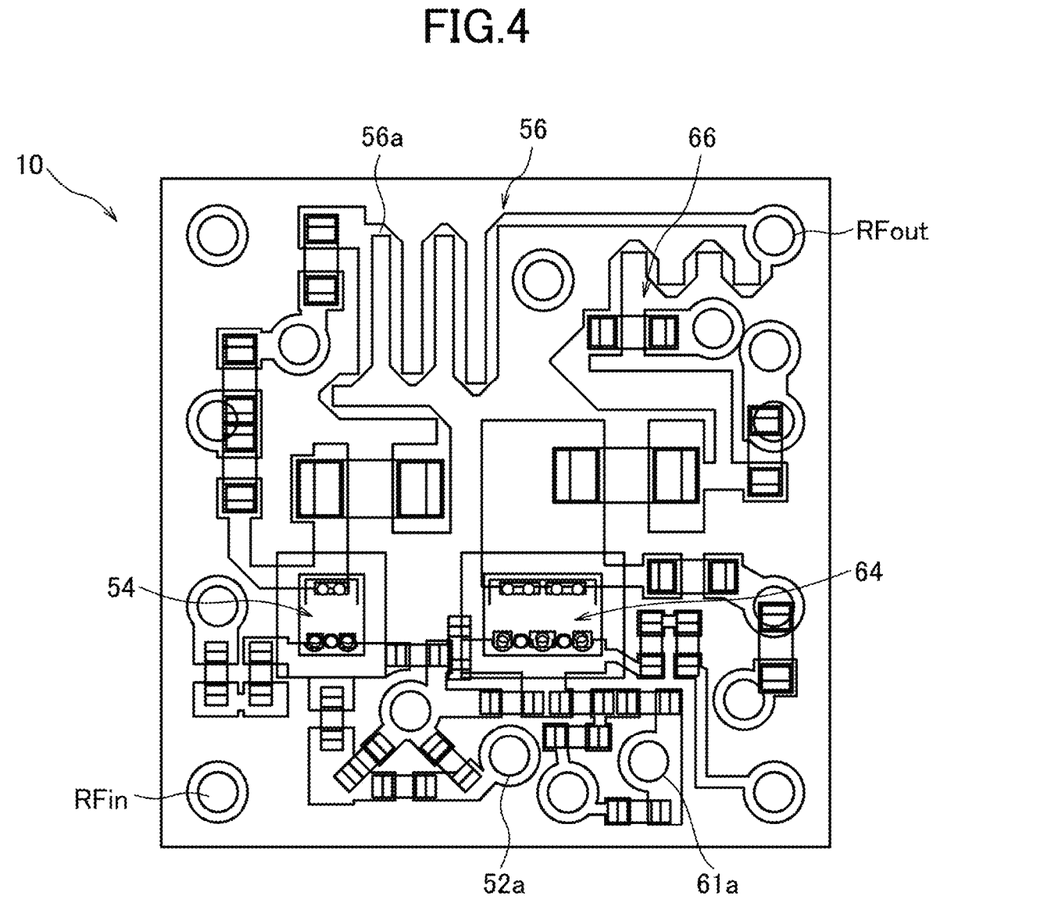
FIG. 4 is a plan view of a lower portion of FIG. 1.

The upper stage 20 illustrated in FIG. 3 and the lower stage 10 illustrated in FIG. 4 have a plane having a substantially similar shape, and both stages are formed, for example, in 6 square mm.

As illustrated in FIG. 1, the RF signal input to the input terminal RFin (the signal via 13a) through a signal wiring 101a provided on the printed circuit board 100 of the communication device passes through the lower stage 10 from the base member La4 illustrated in FIG. 1, passes through the signal vias 13a, 13b, and 13c illustrated in FIG. 1, and is input to the lower left corner portion of the upper stage 20 in FIG. 3 without being connected to any portion of the lower stage 10. The driver amplifier 40 is implemented near a lower left portion of the upper stage 20, and the RF signal amplified by the driver amplifier 40 greatly turns as indicated by the curve pattern 49 in FIG. 3. Specifically, the RF signal travels toward the upper side of the upper stage 20 in FIG. 3, then turns to the right and travels along the upper side, then turns to the right and travels toward the lower side of the upper stage 20, and reaches the branch circuit 51 provided in the upper stage 20 that is the same as the stage in which the driver amplifier 40 is provided.

The branch circuit 51 is, for example, a Wilkinson type distributor, and equally divides the RF signal amplified by the driver amplifier 40 and outputs the divided signals to an input path on the peak amplifier side and an input path on the carrier amplifier side.

One signal of the RF signals (the input path on the carrier amplifier side) distributed by the branch circuit 51 passes through the predetermined curve pattern 52 and travels from the via 52a formed near the lower side of the upper stage 20 in FIG. 3 to the lower stage 10. For example, the one of the RF signals passes through a path substantially the same as the signal path formed through the signal vias 14a and 14b illustrated in FIG. 1. With respect to this, the other signal of the RF signals (the input path on the peak amplifier side) distributed by the branch circuit 51 reaches the phase adjustment circuit 61 provided in the upper stage 20 that is the same as the stage in which the driver amplifier 40 is provided.

The phase adjustment circuit 61 delays the phase of the input signal of the peak amplifier 64 by a predetermined distribution constant. For example, the phase is delayed by 90°. The RF signal passing through the phase adjustment circuit 61 travels from the via 61a formed near the lower side of the upper stage 20 in FIG. 3 to the lower stage 10. This RF signal also passes through a path substantially the same as the signal path formed through the signal vias 14a and 14b illustrated in FIG. 1.

In the present embodiment, an example, in which the phase adjustment circuit 61 is not disposed between the branch circuit 51 and the carrier amplifier 54, but is disposed between the branch circuit 51 and the peak amplifier 64, has been described. However, the present disclosure is not limited to this example. For example, it is conceivable that the phase adjustment circuit is not disposed between the branch circuit 51 and the peak amplifier 64, but is disposed between the branch circuit 51 and the carrier amplifier 54 to delay the phase of the input signal of the carrier amplifier 54.

The Doherty amplifier 50 in the present embodiment is an asymmetric Doherty amplifier, and the peak amplifier 64 and the carrier amplifier 54 each exhibit a different maximum output intensity for the input RF signal. For example, the peak amplifier 64 has a saturation output (size) approximately twice larger than the carrier amplifier 54, and the peak amplifier 64 starts the amplification operation when the output of the carrier amplifier 54 reaches a saturation region. Specifically, the carrier amplifier 54 operates in class AB or B. The peak amplifier 64 operates in class C. When the instantaneous power is low, the carrier amplifier 54 operates and the peak amplifier 64 does not operate, thereby increasing the power efficiency. When the instantaneous power is high, both the carrier amplifier 54 and the peak amplifier 64 operate, thereby increasing the saturation power while maintaining the high power efficiency.

As an example, output examples of the driver amplifier 40, the carrier amplifier 54, and the peak amplifier 64 are described. The driver amplifier 40 having an output of 10 W, the carrier amplifier 54 having an output of 15 W, and the peak amplifier 64 having an output of 30 W are used. Here, the output of 10 W solely refers to the size of the FET, and is used to indicate that the amplifier does not always outputs 10 W and that the amplifier has the size enough for the output of 10 W.

The RF signal amplified by the carrier amplifier 54 reaches the Doherty network 56 on the carrier amplifier side that is provided in the lower stage 10. The Doherty network 56 is provided with a 90° transmission line (also called a λ/4 line) 56a. Thus, the RF signal amplified by the carrier amplifier 54 is combined with the output signal of the peak amplifier 64 described below and is output from the output terminal RFout provided in the upper right corner of the lower stage 10 in FIG. 4 through the 90° transmission line 56a.

With respect to the above, the RF signal amplified by the peak amplifier 64 reaches the Doherty network 66 on the peak amplifier side that is provided in the lower stage 10, and is combined with the output signal of the carrier amplifier 54 and is output from the output terminal RFout through a signal path formed through the signal via 16a in FIG. 1. The signal output from the output terminal RFout is transmitted from the high frequency amplifier 1 to the outside through the signal wiring 101b provided on the printed circuit board 100 of the communication device as illustrated in FIG. 1. Here, the Doherty network 56 on the carrier amplifier side and the Doherty network 66 on the peak amplifier side correspond to a Doherty network of the present disclosure.

Figure 5:
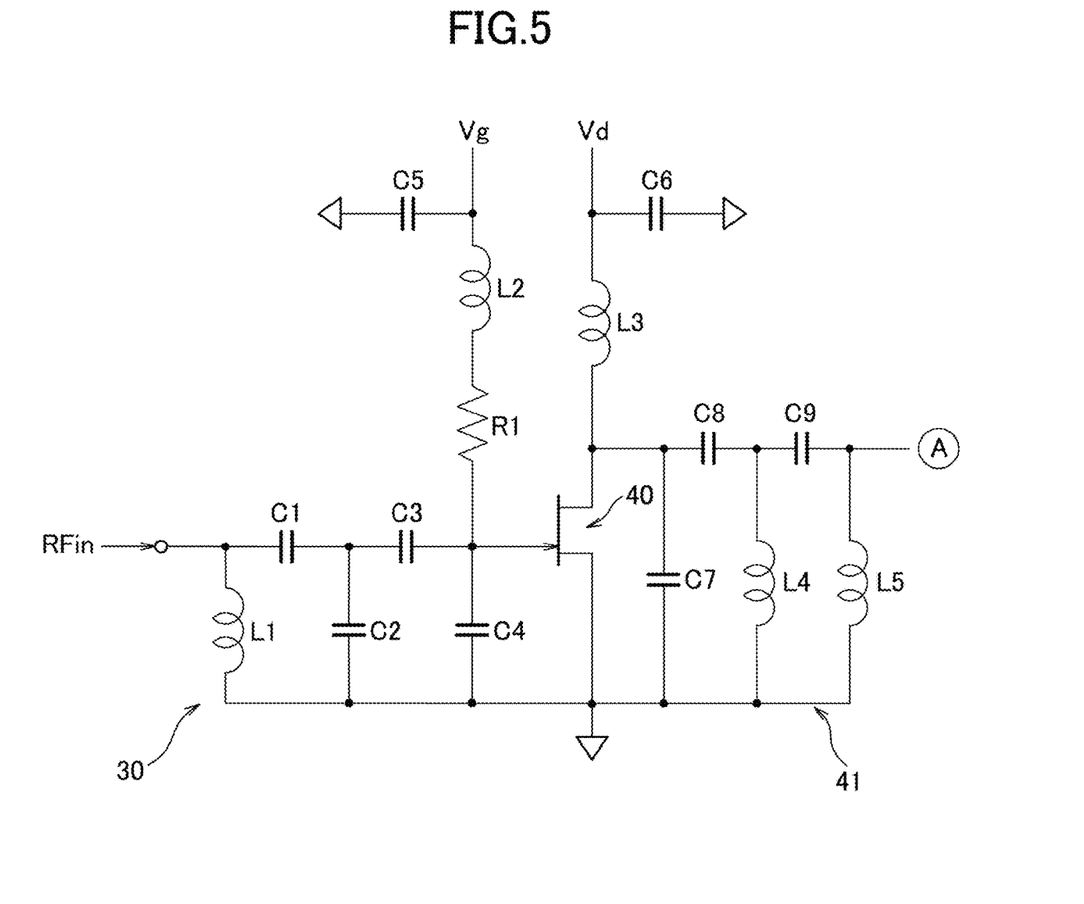
FIG. 5 is a circuit diagram of a driver amplifier circuit of FIG. 1.
Figure 6:
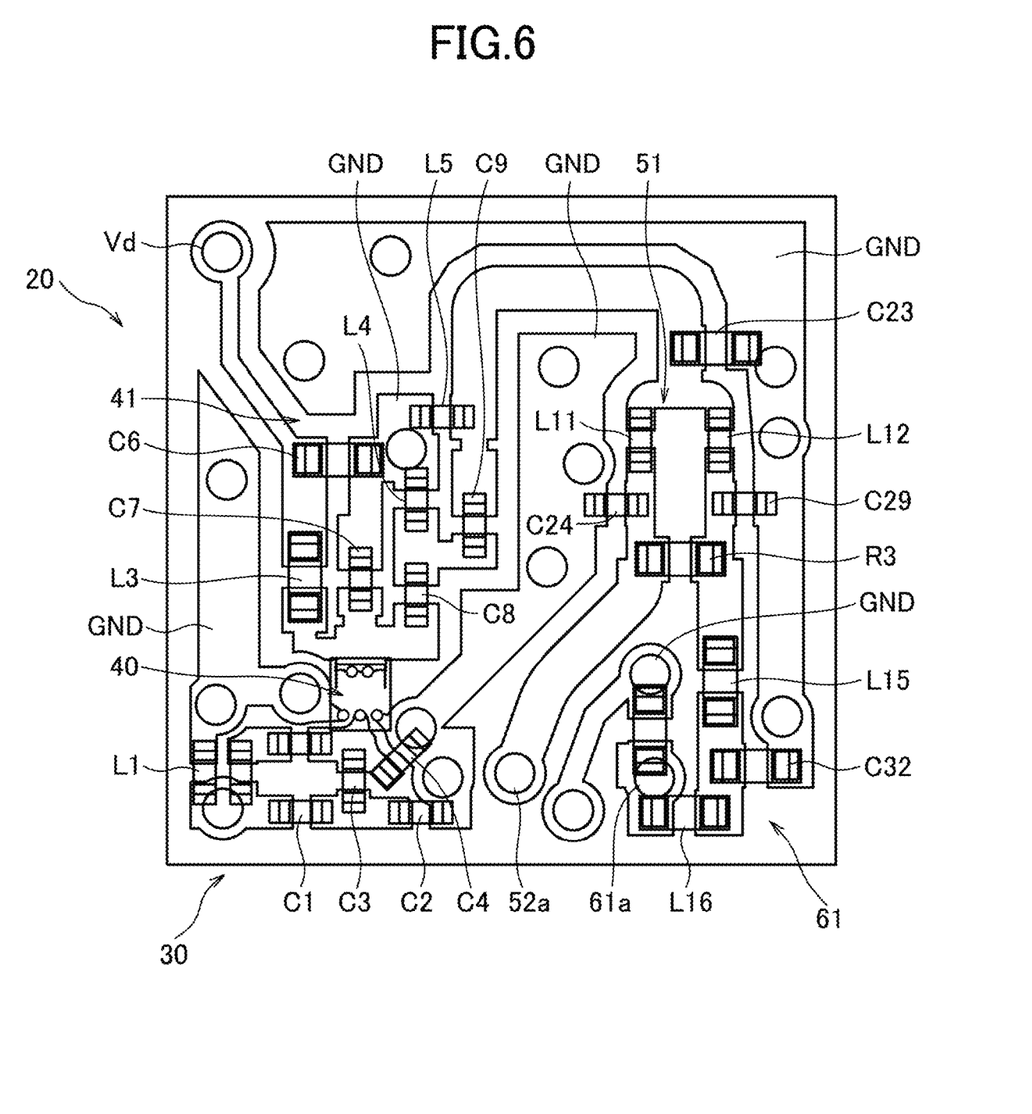
FIG. 6 is a diagram depicting an upper portion corresponding to the circuit diagram of FIG. 5.

FIG. 5 is a circuit diagram of the driver amplifier of FIG. 1, and FIG. 6 is a diagram depicting the upper stage corresponding to the circuit diagram of FIG. 5. FIG. 7 is a circuit diagram of the Doherty amplifier of FIG. 1, and FIG. 8 depicts the lower stage corresponding to the circuit diagram of FIG. 7.

The RF signal input from the input terminal RFin illustrated in FIG. 5 is input to the gate of the driver amplifier 40 through an input matching circuit 30 (a total of five of the inductor L1 and the capacitors C1 to C4). A gate bias is supplied from a power supply Vg through the inductor L2. The capacitor C5 is a bypass capacitor of the power supply Vg, and a resistor R1 is an adjustment resistor.

The drain output of the driver amplifier 40 is provided to the branch circuit 51 through the output matching circuit 41 (inductors L4 and L5 and capacitors C7 to C9). A drain bias is supplied from a power supply Vd through the inductor L3. The capacitor C6 is a bypass capacitor of the power supply Vd.

Figure 7:
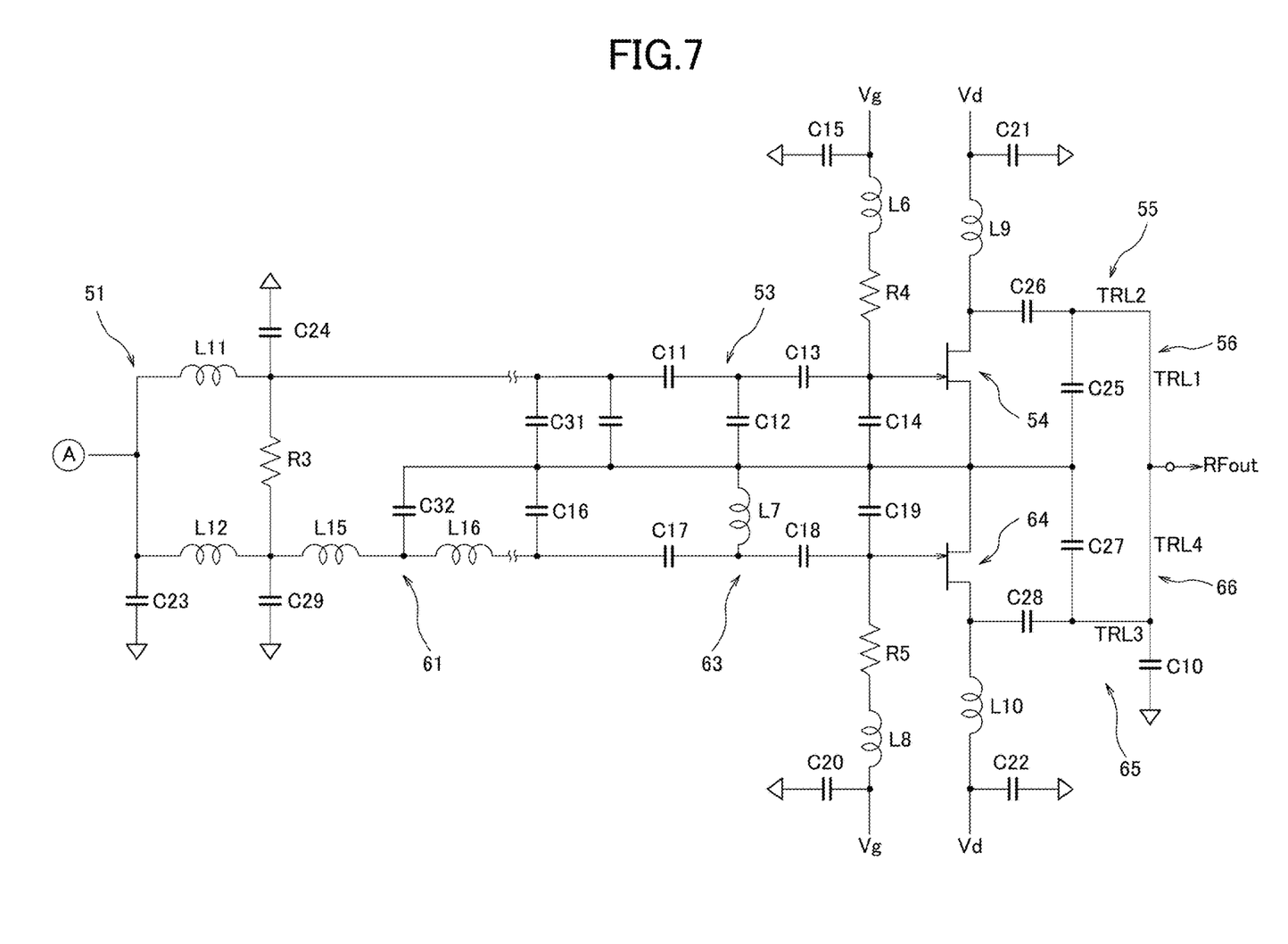
FIG. 7 is a circuit diagram of a Doherty amplifier circuit of FIG. 1.
Figure 8:
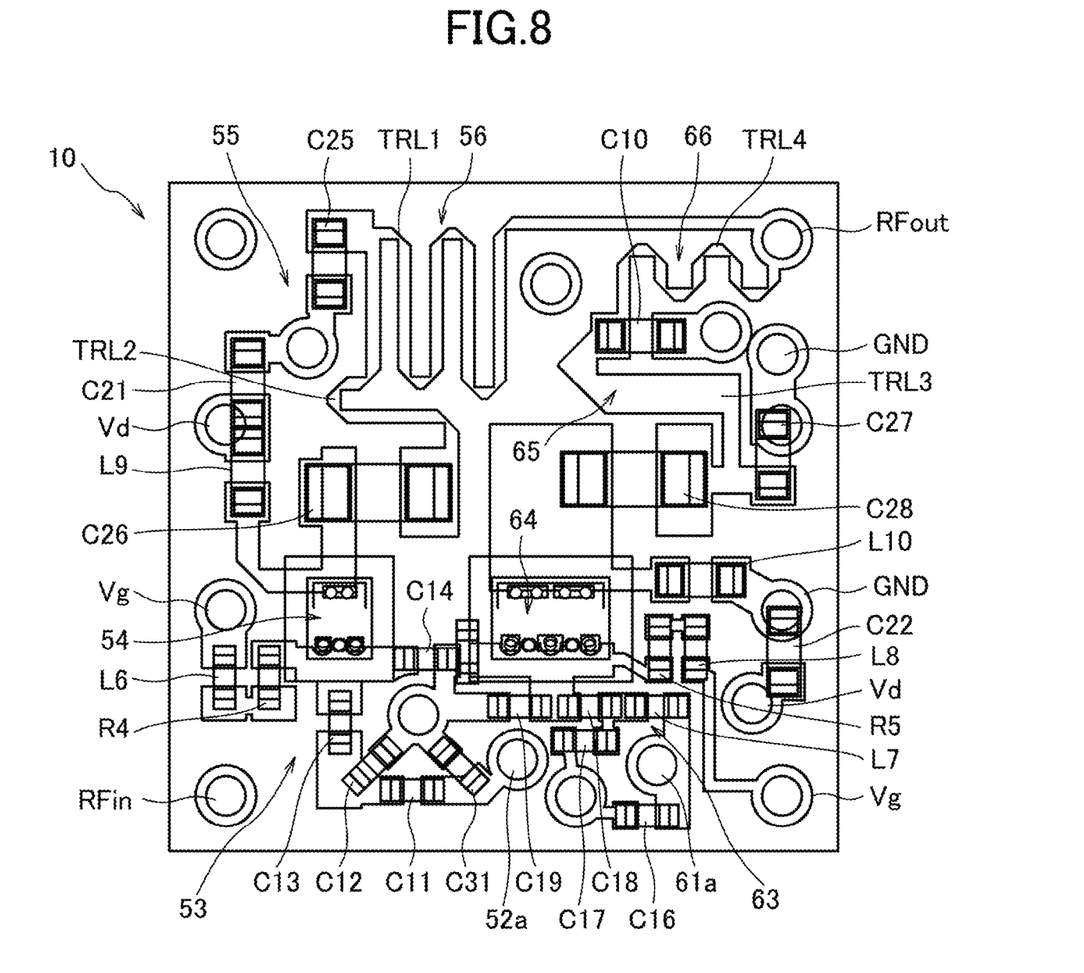
FIG. 8 is a drawing depicting a lower portion corresponding to the circuit diagram of FIG. 7.

Next, as illustrated in FIG. 7, in the branch circuit 51, the RF signal from the driver amplifier 40 is equally divided and output to a matching circuit formed by L11 and C24 and a matching circuit famed by C23, L12, and C29.

The phase-adjusted RF signal in the matching circuit famed by L11 and C24 reaches the lower stage 10 through the curve pattern 52 and the via 52a described with reference to FIG. 3 and travels toward the carrier amplifier 54.

The RF signal that reaches the lower stage 10 is input to the gate of the carrier amplifier 54 through the input matching circuit 53 (capacitors C31, and C11 to C14). The gate bias is supplied from the power supply Vg through an inductor L6. The capacitor C15 is a bypass capacitor of the power supply Vg and a resistor R4 is an adjustment resistor.

The drain output of the carrier amplifier 54 is provided to the Doherty network 56 on the carrier amplifier side through a capacitor C26 for DC blocking. The drain bias is supplied from the power supply Vd through an inductor L9. A capacitor C21 is a bypass capacitor of the power supply Vd.

The Doherty network 56 on the carrier amplifier side includes a transmission line TRL2, the output matching circuit 55 including a capacitor C25, and a transmission line TRL1 (including the 90° transmission line 56a described with reference to FIG. 4) for combining the output of the carrier amplifier 54 and the output of the peak amplifier 64.

With respect to the above, the RF signal that is equally divided by the branch circuit 51 and that is phase-adjusted by the matching circuit formed by C23, L12, and C29, is further phase-adjusted by the phase adjustment circuit 61 (inductors L15 and L16, and a capacitor C32), reaches the lower stage 10 through the via 61a, and travels toward the peak amplifier 64.

The RF signal that reaches the lower stage 10 is input to the gate of the peak amplifier 64 through the input matching circuit 63 (an inductor L7 and capacitors C16 to C19). The gate bias is supplied from the power supply Vg through an inductor L8. A capacitor C20 is a bypass capacitor of the power supply Vg and a resistor R5 is an adjustment resistor.

The drain output of the peak amplifier 64 is provided to the Doherty network 66 on the peak amplifier side through a capacitor C28 for DC blocking. The drain bias is supplied from the power supply Vd through an inductor L10. A capacitor C22 is a bypass capacitor of the power supply Vd.

The Doherty network 66 on the peak amplifier side is configured by a two-stage configuration of the capacitor C27 and the capacitor C10, the output matching circuit 65 configured by a transmission line TRL3, and a transmission line TRL4.

Comparing the above-described amplifier outputs, the current or power consumption, and the resulting heat generation of the respective amplifier outputs are expected to be greater in the order of the peak amplifier 64, the carrier amplifier 54, and the driver amplifier 40. The high frequency amplifier 1 according to the present embodiment is configured such that the peak amplifier 64 and the carrier amplifier 54, which generate greater heat, are provided with the second heat dissipation path having a higher heat dissipation efficiency, and the driver amplifier 40, which generates less heat, is provided with the first heat dissipation path. This arrangement allows the high frequency amplifier 1 to provide a compact high frequency amplifier having an excellent heat dissipation property.

In the high frequency amplifier 1, the peak amplifier 64 and the carrier amplifier 54 are provided with the second heat dissipation path, and the driver amplifier 40 is provided with the first heat dissipation path, so that, as illustrated in FIG. 1, the RF signal input to the input terminal RFin (the signal via 13a) passes through the lower stage 10 from the base member La4, passes through the signal vias 13a, 13b, and 13c illustrated in FIG. 1, and is input to the lower left corner portion of the upper stage 20 in FIG. 3 without being connected to any portion of the lower stage 10. Additionally, the RF signals distributed by the branch circuit 51 are input to the peak amplifier 64 and the carrier amplifier 54 provided in the lower stage 10, and pass through paths substantially the same as the signal path formed through the signal vias 14a and 14b illustrated in FIG. 1. By passing through these signal paths, the high frequency amplifier 1 can provide a compact high frequency amplifier having an excellent heat dissipation property.

It should be understood that the embodiment disclosed herein is exemplary in all respects and is not restrictive. The scope of the present disclosure is not meant as described above, but is set forth by the appended claims, and is intended to include all modifications within the equivalent meaning and the scope of the claims.

DESCRIPTION OF THE REFERENCE NUMERALS

1 . . . radio frequency amplifier, 10 . . . lower stage, 11 . . . first dielectric layer, 12 . . . second dielectric layer, 13a, 13b, 13c, 14a, 14b, 16a, 17a . . . signal via, 15a, 15b, 15c, 15d . . . heat dissipation via, 20 . . . upper stage, 23 . . . third dielectric layer, 24 . . . fourth dielectric layer, 25 . . . lid member, 30 . . . input matching circuit, 40 . . . driver amplifier, 40a . . . front surface, 40b . . . back side, 41 . . . output matching circuit, 49 . . . curved pattern, 50 . . . Doherty amplifier, 51 . . . branch circuit, 52 . . . curved pattern, 52a . . . via, 53 . . . input matching circuits, 54 . . . carrier amplifier 54a . . . front surface, 54b . . . back surface, 55 . . . output matching circuit, 56, 66 . . . Doherty network, 56a . . . 90° transmission line, 61 . . . phase adjustment circuit, 61a . . . via, 63 . . . input matching circuit, 64 . . . peak amplifier 64a . . . front surface, 64b . . . back surface, 65 . . . output matching circuit, 100 . . . printed circuit board, 101a, 101b . . . wiring on printed circuit board, La0 . . . zeroth wiring layer (heat dissipation portion), La1 . . . first wiring layer, La2 . . . second wiring layer, La3 . . . third wiring layer, La4 . . . base member, RFin . . . input terminal, RFout . . . output terminal, L, L1-L12, L15, L16 . . . inductor, C, C1-C29, C31, C32 . . . capacitor, R1, R3-R5 . . . resistor, TRL1-TRL4 . . . transmission line, Vd, Vg . . . power supply

The invention claimed is:

1. A high frequency amplifier comprising:
an asymmetric Doherty amplifier configured to amplify a high frequency signal having a wavelength λ, the high frequency signal being input, and the asymmetric Doherty amplifier including a carrier amplifier and a peak amplifier, the peak amplifier being configured to start an amplifying operation when an output of the carrier amplifier reaches a saturation region and having a saturation output different from a saturation output of the carrier amplifier;

a driver amplifier configured to drive the asymmetric Doherty amplifier;

a branch circuit configured to branch the high frequency signal amplified by the driver amplifier into an input path on a peak amplifier side and an input path on a carrier amplifier side;

a phase adjustment circuit configured to delay either a phase of a signal input to the peak amplifier or a phase of a signal input to the carrier amplifier, the phase adjustment circuit being provided on either the input path on the peak amplifier side or the input path on the carrier amplifier;

a first substrate on which the carrier amplifier and the peak amplifier are mounted; and a second substrate on which the driver amplifier, the branch circuit, and the phase adjustment circuit are mounted, wherein an input terminal of the driver amplifier and an input terminal of the carrier amplifier are disposed at positions where the input terminal of the driver amplifier and the input terminal of the carrier amplifier project to each other when the second substrate is stacked on the first substrate, and wherein an electrical length from the input terminal of the driver amplifier to an output terminal of the carrier amplifier is set to a phase of $(2n+1)\times\pi$, where n is an integer greater than or equal to 0.

2. The high frequency amplifier as claimed in claim 1, wherein a phase difference between a high frequency signal at the output terminal of the carrier amplifier and a high frequency signal at an output terminal of the peak amplifier is in a range of $\pi/2$ to $3\pi/2$.

3. The high frequency amplifier as claimed in claim 1, wherein a grounded metal layer is disposed between the first substrate and the second substrate.

4. The high frequency amplifier as claimed in claim 1, wherein the first substrate has a planar shape projected by the second substrate.

5. The high frequency amplifier as claimed in claim 1, wherein the saturation output of the peak amplifier is configured to be greater than the saturation output of the carrier amplifier.

* * * * *